United States Patent
Brnada

(10) Patent No.: US 8,258,773 B2
(45) Date of Patent: Sep. 4, 2012

(54) SYSTEM FOR DETECTING LIGHTNING STRIKES ON WIND TURBINE ROTOR BLADES

(75) Inventor: Josip Brnada, Willoughby, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/156,541

(22) Filed: Jun. 9, 2011

(65) Prior Publication Data

US 2012/0025804 A1    Feb. 2, 2012

(51) Int. Cl.
    *G01R 31/02*    (2006.01)
(52) U.S. Cl. .......................................... 324/72; 324/72.5
(58) Field of Classification Search .................. None
    See application file for complete search history.

(56) References Cited

U.S. PATENT DOCUMENTS

| 4,105,966 A * | 8/1978 | Lennon et al. ................. 324/113 |
| 5,422,778 A * | 6/1995 | Good et al. ..................... 361/92 |
| 6,868,339 B2 * | 3/2005 | Murphy et al. ..................... 702/4 |
| 7,468,505 B2 | 12/2008 | Kraemer |
| 7,508,186 B2 | 3/2009 | Mortenson |
| 2007/0041834 A1 | 2/2007 | Schram et al. |
| 2008/0129113 A1 * | 6/2008 | Robertson et al. ............. 307/9.1 |
| 2009/0237272 A1 * | 9/2009 | Georgeson et al. ........... 340/945 |

OTHER PUBLICATIONS

Publication—"Lightning Strike Sensor for Wind Turbines", Jan. 2001, DEFU Report 454.

* cited by examiner

*Primary Examiner* — Jeff Natalini
(74) *Attorney, Agent, or Firm* — Dority & Manning, P.A.

(57) ABSTRACT

A system and method for detecting lightning strikes on a wind turbine includes detecting and measuring a parameter that is indicative of a lightning strike, which may be current induced in a conductor as a result of the lightning strike. A current receptor may be located on a component of the wind turbine and electrically coupled to a ground conductor. A current sensor is disposed on the ground conductor and generates a primary current I(p) that is proportional to a lightning strike current flowing through the ground conductor upon a lighting strike on the receptor. A signal converter sub-system is configured to convert the primary current I(p) into a processing signal. A processing sub-system is configured to receive and use the processing signal to determine an actual lightning strike on the wind turbine.

19 Claims, 4 Drawing Sheets

SYSTEM FOR DETECTING LIGHTNING STRIKES ON WIND TURBINE ROTOR BLADES

FIELD OF THE INVENTION

The present subject matter relates generally to wind turbines, and more particularly to a system that detects lightning strikes on the wind turbine blades.

BACKGROUND OF THE INVENTION

Large commercial wind turbines are prone to lightning strikes and, in this regard, it is a common practice to provide the turbine blades with lightning receptors spaced along the longitudinal length of the blade so as to capture and conduct the strikes to ground. The conventional lightning protection systems do not, however, provide an indication of an actual lightning strike or the magnitude of any such strike, which is an important consideration with respect to potential repairs, damage control, and warranty claims. For example, the wind turbine blades are generally warranted from the manufacturer to withstand a lightning strike within a certain design specification, for example up to a 100 kA strike. Although it may be possible to determine that damage done to a blade is the result of a lightning strike, to date there has not been a reasonable and cost-effective way to access the magnitude of the strike and, thus, whether or not the damage is covered by warranty.

The conventional lightning protection systems are also not generally configured to give a remote indication of an actual strike, magnitude of the strike, time of the strike, and other real-time parameters that may be important to the operator of the wind turbine, for example to make a real-time decision as to whether or not the wind turbine should be immediately shut down to prevent further possible damage.

Accordingly, the industry would benefit from an improved lightning protection system for wind turbines that registers parameters of an actual lightning strike and a produces remote, real-time indication of any such strike.

BRIEF DESCRIPTION OF THE INVENTION

Aspects and advantages of the invention will be set forth in part in the following description, or may be obvious from the description, or may be learned through practice of the invention.

In a particular embodiment, a system for detecting lightning strikes on a wind turbine is provided. The system includes a lightning strike receptor located on a component of the wind turbine and electrically coupled to a ground conductor. A current sensor is disposed on the ground conductor and generates a primary current I(p) that is proportional to the current flowing through the ground conductor as a result of the lighting strike. A signal converter sub-system is configured with the current sensor to convert the primary current I(p) into a useful processing signal. A processing sub-system is configured to receive and use the processing signal to determine an actual lightning strike on the wind turbine. For example, in one embodiment, the processing signal may be compared to a threshold value for providing an indication of a lightning strike on the wind turbine, as well as any other control or monitoring function. Multiple threshold values may be set for ease of magnitude detection The processing sub-system may, in certain embodiments, be configured to generate an alert when the processing signal exceeds the threshold value. The processing sub-system may also be interfaced with a wind turbine controller, wherein the alert is transmitted to wind turbine controller. The wind turbine controller may, in turn, transmit the alert to a remote monitoring station.

The processing sub-system may include a processing unit that is configured to define a magnitude of the lightning strike as a function of the processing signal. For example, the magnitude of the processing signal may be proportional to the current generated in the ground conductor as a result of the lightning strike. Multiple threshold values may be set for ease of magnitude detection, wherein the threshold values defines magnitude ranges.

The system is not limited to any particular placement or number of receptors and associated current sensors. In a particular embodiment, one or more receptors are mounted to one or each of the wind turbine blades and are electrically coupled to a ground conductor disposed within the blade. A single current sensor may be configured with the blade ground conductor so as to detect a strike on any of the receptors associated with the blade. In an alternate embodiment, a current sensor may be associated with each receptor, for example along a line that connects the receptor to a central line of the blade ground conductor. This embodiment may allow for determination of the precise receptor that was struck by the lightning. With either embodiment, a lighting strike on the individual respective blade is detected and registered by the processing sub-system.

In a specific embodiment, the current sensor includes a core member wrapped with a primary winding, with the core member disposed around the ground conductor. Current flow through the ground conductor induces the primary current I(p) in the primary winding. With this embodiment, the signal converter sub-system may include one or more current transformers arranged in series with the current sensor to step down the primary current I(p) to a signal current I(s). The signal converter sub-system may further convert the signal current I(s) to a signal voltage V(s), wherein the signal voltage V(s) is compared to a threshold voltage for providing an indication of a lightning strike on the wind turbine, or for any other control or monitoring function.

It should be appreciated that the present invention also encompasses any manner of wind turbine that incorporates aspects of the system discussed above. For example, such a wind turbine may have a plurality of turbine blades mounted to a rotor hub, with each of the turbine blades having a root, a tip, and a pressure side and a suction side extending between the tip and the root. The turbine blades may have a one or more lightning receptors configured along either or both of the pressure or suction sides, with the receptors coupled to a blade ground conductor disposed within the blade. The blade ground conductor is electrically coupled to a main ground conductor. A current sensor may be disposed on the main ground conductor to detect a strike on any of the receptors on any of the blades. In an alternate configuration, a current sensor may be configured with each blade ground conductor to detect a strike on that respective blade. In still another embodiment, a current sensor may be associated with each respective receptor so as to detect strikes at individual locations on the blade. The current sensor and associated signal and processing sub-systems may be configured as discussed above and described in greater detail herein.

The invention also encompasses various method embodiments for detecting lightning strikes on a wind turbine. The method includes detecting and measuring a parameter that is indicative of an actual lightning strike on a component of the wind turbine. In certain embodiments, this parameter may be a current induced in a conductor as the result of a lightning strike on the wind turbine component. The measured parameter is compared to a threshold value, wherein the threshold value is set such that a magnitude of the measured parameter equal to or exceeding the threshold value indicates an actual lightning strike on the wind turbine.

In a particular method embodiment, a plurality of the threshold values may be set to define ranges within which the measure parameter falls, whereby a magnitude of the lightning strike is determined by the ranges. One of the threshold values may be set at a warranty limit for the component of the wind turbine blade struck by lightning, for example at the warranted current limit of a wind turbine blade.

The method may also include transmitting indication of an actual lightning strike to a remote monitoring station.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
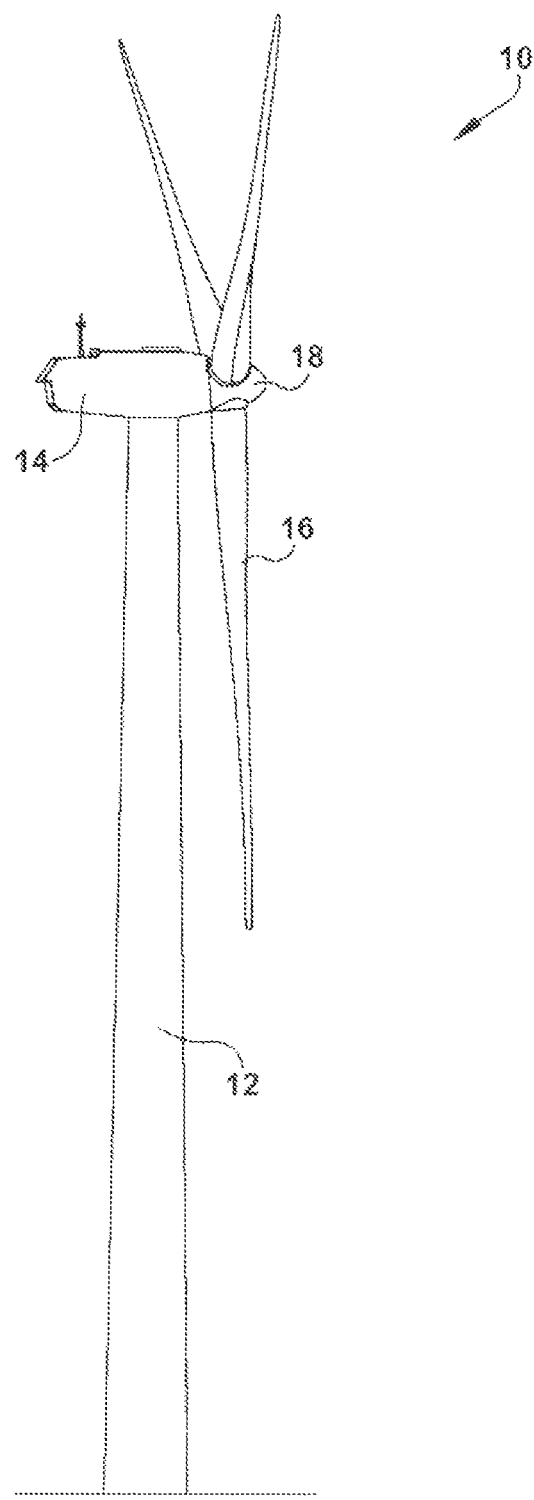
FIG. 1 illustrates a perspective view of a conventional wind turbine.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

The present invention relates to a method and system for detecting lightning strikes on a wind turbine, wherein a parameter that is indicative of an actual lighting strike on a component of the wind turbine is detected and measured. The measured parameter may be compared to a threshold value, wherein the threshold value is set such that a magnitude of the measured parameter equal to or exceeding the threshold value indicates an actual lightning strike on the wind turbine. The invention is not limited to any particular measured parameter. In the embodiments illustrated in the figures and described below, the measured parameter is a current induced in a conductor as a result of a lightning strike on a component of the wind turbine.

Referring to the drawings, FIG. 1 illustrates a perspective view of a horizontal axis wind turbine 10. It should be appreciated that the wind turbine 10 may be a vertical-axis wind turbine. In the illustrated embodiment, the wind turbine 10 includes a tower 12, a nacelle 14 mounted on the tower 12, and a rotor hub 18 that is coupled to the nacelle 14. The tower 12 may be fabricated from tubular steel or other suitable material. The rotor hub 18 includes rotor blades 16 coupled to and extending radially outward from the hub 18. As shown, the rotor hub 18 includes three rotor blades 16. However, in an alternative embodiment, the rotor hub 18 may include more or less than three rotor blades 16.

The rotor blades 16 may generally have any suitable length that enables the wind turbine 10 to function according to design criteria. For example, the rotor blades 16 may have a length ranging from about 15 meters (m) to about 91 m. However, other non-limiting examples of blade lengths may include 10 m or less, 20 m, 37 m, or a length that is greater than 91 m. The rotor blades 16 rotate the rotor hub 18 to enable kinetic energy to be transferred from the wind into usable mechanical energy, and subsequently, electrical energy. Specifically, the hub 18 may be rotatably coupled to an electric generator (not illustrated) positioned within the nacelle 14 for production of electrical energy.

Figure 2:
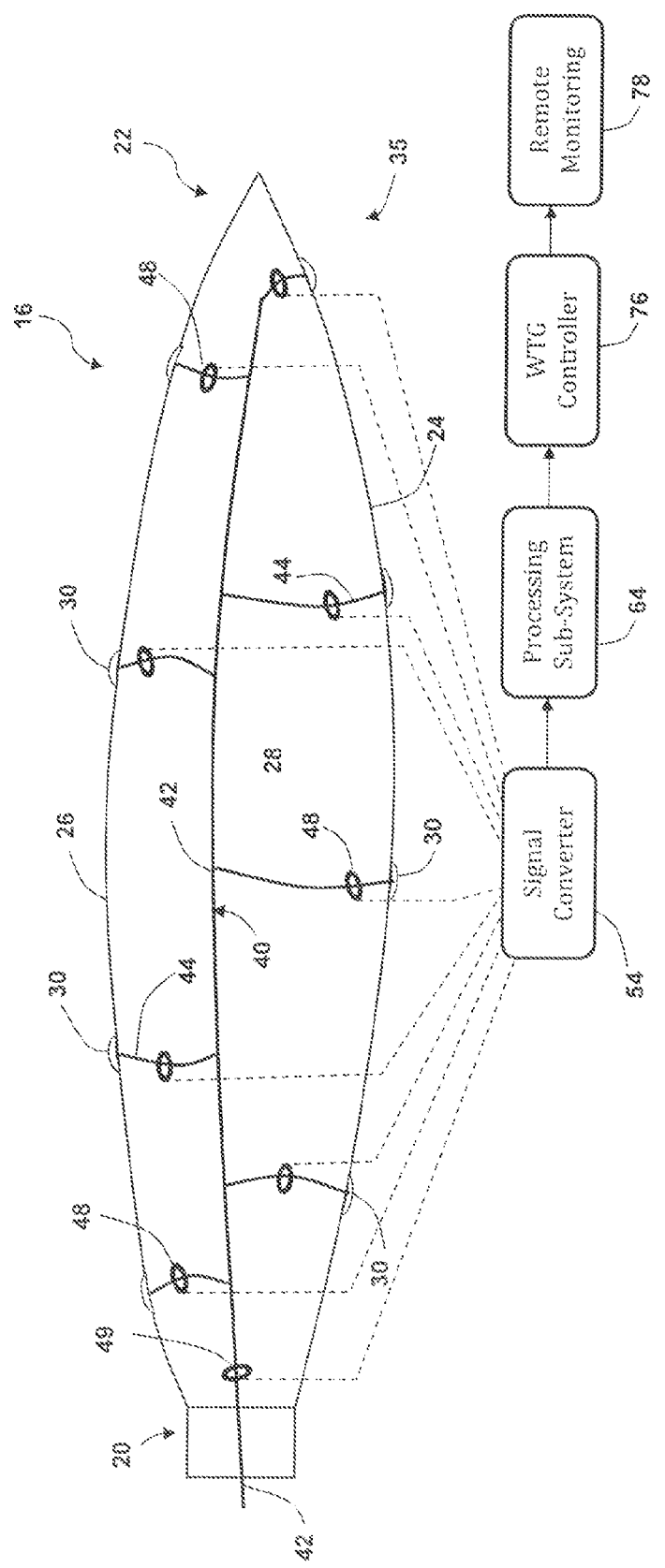
FIG. 2 illustrates a longitudinal cross-sectional view of a rotor blade with a plurality of lightning strike receptors configured in a system in accordance with aspects of the invention.

FIG. 2 is a longitudinal cross-section view of an exemplary blade 16 incorporating aspects of a system 35 for detecting lightning strikes on the blade 16. The blade 16 has a root 20 and a tip 22, with a pressure side 24 and suction side 26 extending between the root 20 and tip 22. An internal cavity 28 is defined between the sides 24, 26. One or more lightning receptors 30 are configured along either or both of the pressure side 24 or suction side 2. For example, in the embodiment illustrated in figures, a plurality of the lightning receptors 30 are provided on each of the pressure side 24 and suction side 26. In an alternative embodiment, the lightning receptors 30 may be provided on only one of the sides 24, 26.

It should be appreciated that the invention is not limited to any particular location of the lightning receptors 30 on the wind turbine 10. For example, receptors 30 may be located on the tower 12 or nacelle 14 instead of or in addition to the receptors 30 provided on the blades 16.

The lightning receptors 30 may be variously configured within the scope of the invention, and include any metal or metalized component (i.e., a metal screen, a metal rod or tip, and the like) mounted on the wind turbine components (such as on the pressure or suction sides 24, 26 of the blades 16) for the purpose of conducting lightning strikes to ground.

Referring for example to FIG. 2, the lighting receptors 30 are electrically coupled to a blade ground conductor 40, which may include multiple components. For example, in the illustrated embodiment, each receptor 30 is connected by a branch line 44 to a central line 42 of the blade ground conductor 40. The branch line 44 may include a post that extends through the pressure or suction sides 24, 26. The lines 42, 44 have a gauge suitable for defining a conductive component of the wind turbine's overall ground system for transmitting a lightning strike on any one of the receptors 30 to ground via connection of the blade ground conductor 40 to the wind turbine's main ground conductor 46 (FIG. 3).

It should be understood that the conductive members 42, 44 may also include any configuration of the blade structure within the blade ground connector 40 circuit, such as carbon spar caps, trailing serrations, leading edge protectors, fairings, and so forth.

Figure 3:
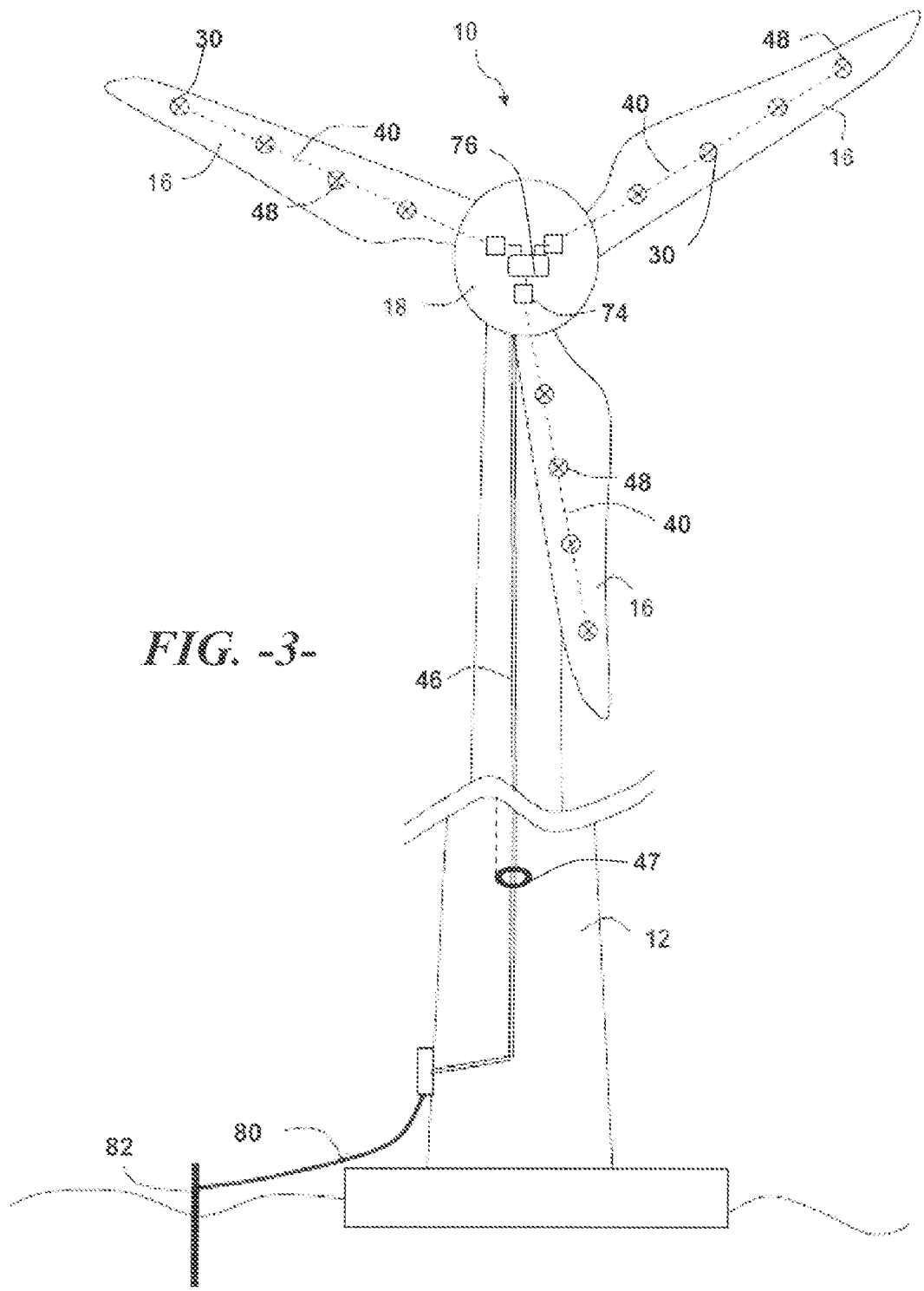
FIG. 3 is an illustration of a wind turbine incorporating a system in accordance with aspects of the invention; and, FIG. 4 is a diagram view of an embodiment of a current sensor and associated sub-systems.

Referring to FIGS. 2 and 3 in general, the system 35 includes at least one current sensor configured on an associated ground conductor. For example, in the embodiment of FIG. 2, current sensors 48 are configured with each of the lightning strike receptors 30. In other words, an individual current sensor 48 is configured with the branch line 44 associated with each lightning strike conductor 30. A current sensor 49 is also configured with the central line 42. As discussed in greater detail below, the current sensors 48, 49 are specifically configured to generate a primary current I(p) that is proportional to the current that flows through the associated ground conductor 42, 44 as a result of a lightning strike on the respective sensor 30. This primary current I(p) is proportional to the lightning strike current that flows through the ground conductor 44, 42.

Figure 4:
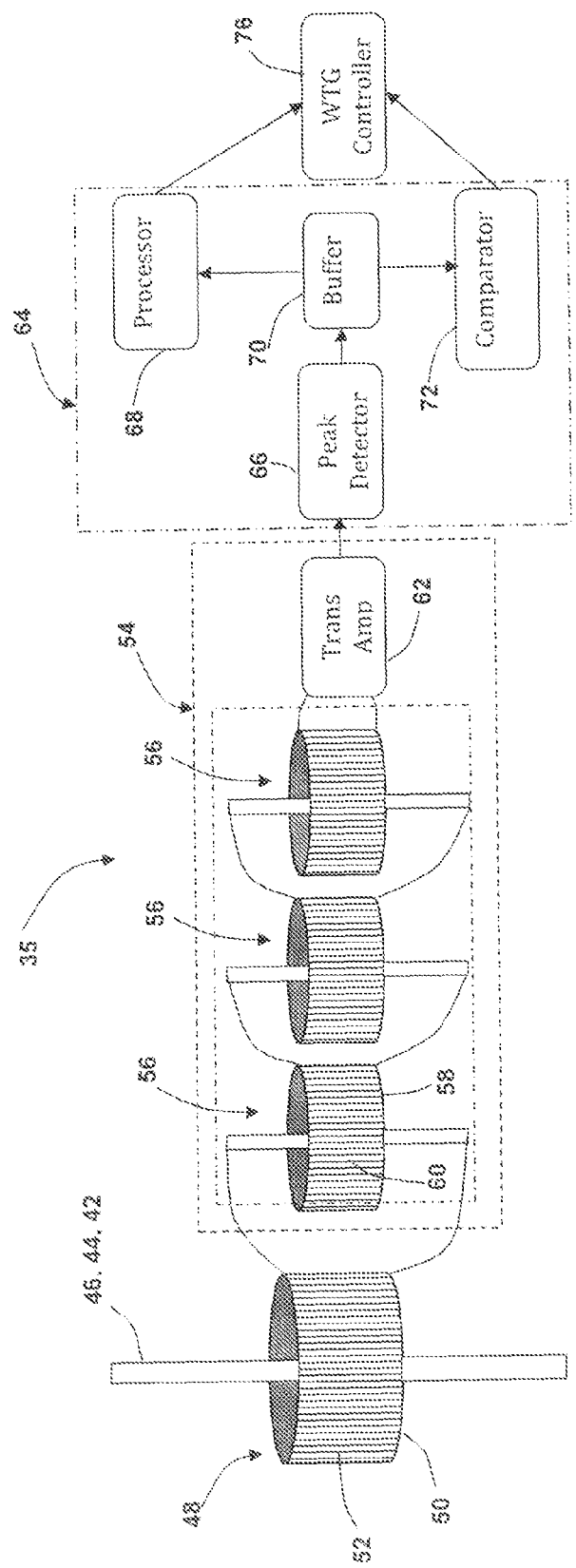

Referring to FIGS. 2 and 4, a signal converter sub-system 54 is operably associated with each of the current sensors 48, 49 and converts the primary current I(p) into a processing signal. In a particular embodiment, this processing signal may be a step down current signal I(s), which may be further converted to, for example, a voltage signal V(s).

The processing signal is then conveyed to a processing sub-system 64 wherein the processing signal is compared to a threshold value. If the processing signal exceeds the threshold value, a positive indication of a lightning strike on the respective receptor 30 is indicated.

The processing sub-system 64 may be configured to generate an alert or alarm when the processing signal exceeds the threshold value. This alert signal may be transmitted to the wind turbine generator controller 76, wherein the alert may be time stamped and recorded along with the value (e.g., magnitude) of the processing signal. The wind turbine generator controller 76 may, in turn, transmit the alert and any other parameters or information associated with the processing signal to any manner of remote monitoring station 78 wherein the information may be used for any purpose, such as scheduling an inspection of the wind turbine generator, issuing a command to shut down the wind turbine generator, initiating a warranty claim investigation, and so forth.

In the embodiment of FIG. 2 wherein an individual respective current sensor 48 is associated with each of the lightning strike receptors 30, the current sensors 48 are in communication with the signal converter 54, as indicated by the dashed lines in the figure. In this particular embodiment, it may be possible to determine a particular strike location on the blade 16. This information may be particularly valuable in that the continuity of each of the strike receptors 30 need not be subsequently verified in a maintenance/inspection procedure. In other words, by initialing identifying the respective receptor 30 that was struck by the lightning (e.g. by tagging I(p) or I(s) with an identifier), a maintenance technician need only verify the integrity and operation of the particular receptor 30 and need not inspect each of the other receptors 30 in the blade. This will save significant time and expense.

In an alternate embodiment, however, the single current sensor 49 configured on the central line 42 of the blade ground connector 40 may be desired in that the expense of configuring multiple current sensors 48 with each of the individual receptors 30 is avoided. If any of the receptors 30 are struck by lightning, the current will flow through the central line 42 and the primary current I(p) will be generated by the sole current sensor 49, regardless which of the receptors 30 was struck.

It should be appreciated that any configuration and number of current sensors 48, 49, may be configured with the blade ground connector 40 in accordance with the scope and spirit of the invention.

Referring again to FIGS. 2 and 4, in a particular embodiment, the current sensors 48, 49 include a core member 50 through which the ground connector 46, 44, 42 runs. The core member 50 is wrapped with a primary winding 52 having a defined number of windings (N). The radius of the core member 50 is defined so that a safe distance is established relative to the ground conductor 44 to prevent the lightning strike current that flows through the ground conductor from jumping to the primary windings 52. The core 50 is formed from a material that decreases the magnetic strength in the primary winding loop, and therefore lessens the induced primary current I(p). The signal converter sub-system 54 may further include one or more secondary current transformers 56 that are arranged in series with the primary current sensor 48 in order to step down the primary current I(p) to a signal current I(s), as indicated in FIG. 4. The series-configured current transformers 56 function as multiple induction coils that scale down the primary current I(p) as a function of the number of turns (N) of windings on each of the current transformers 56 in accordance with the following formula: $I(s)=I(p)/(N1 \times N2 \times N3 \times \ldots)$, where N is the number of turns for each specific coil.

In the illustrated embodiment, the signal converter sub-system 54 may further include a transimpedance amplifier 62 that accepts the current I(s) from the last stage transformer 56 and converts this current to a voltage signal V(s). This amp 62 may include any configuration of operational amplifiers that allow for detection of strikes above a threshold value, as well as whether the discharge is positive or negative. The gain of the transimpedance amplifier 62 may be set by appropriate gain resistors to achieve the desired operating voltage range.

According to FIG. 4, the processing sub-system 64 may include any manner of hardware/software configuration for performing various desired functions with the processing signal. For example, the sub-system 64 may include a peak detector 66 that serves to record the highest voltage sensed and retain the voltage value for subsequent processing. The processing signal V(s) is buffered by a buffer 70 and directed to a comparator 72 and a processing unit 68. The comparator 72 is designed to set a bit high when the processing signal V(s) exceeds a threshold value. For example, the comparator 72 may be set to alert when a voltage is sensed corresponding to an initial 100 kA current in the ground detector, which is indicative of a lightning strike. The processor 68 may be used for any manner of further processing, such as determining and registering an actual magnitude value for the processing signal.

Magnitude determination may be accomplished by comparing the processing signal to a plurality of threshold values, which define magnitude ranges. A processing signal that exceeds a given threshold value but not the next subsequent value falls within the magnitude range defined by the threshold values.

The system 35 may include any manner of surge protection to protect the system components from excessive current spikes or to limit the maximum sensed voltage. For example, a varistor may be used to clamp to a maximum voltage, or a fuse could be used to protect the circuitry from current spikes.

As mentioned, the processing sub-system 64 may be in communication with the wind turbine controller 76, in particular, the processing unit 68 and comparator 72, for transmitting any information or parameter related to the processing signal to the controller 76.

Referring to FIG. 3 in general, it should be appreciated that the invention also encompasses any manner of wind turbine 10 that incorporates aspects of the present invention, particularly the system 35 discussed above for detecting lightning strikes on the wind turbine. In the embodiment of FIG. 3, each of the blades 16 includes a plurality of current sensors 48 configured with individual respective strike detectors 30. The ground conductor 40 for each respective blade 16 is electrically coupled to the main ground conductor 46, which is in turn connected to a ground cable 80 and ground rod 82. The ground path between the blade ground connectors 40 and the main ground connector 46 may include any conductive path defined by the wind turbine machinery or support structure, including blade bearings, machinery bed plates, tower structure, and the like. The current sensors 48 (or associated subsystems) may be in communication with the wind turbine generator controller 76 yet any manner of relay or junction 74, as depicted in FIG. 3.

FIG. 3 also depicts a current sensor 47 configured on the main ground connector 46. It should be appreciated that this single current sensor 47 may be utilized to detect a lightning strike on any receptor 30 located at any position on the wind turbine 10 in that the lightning strike current is eventually conducted through the main ground connector 46. Thus, a lightning strike on any one of the receptors 30 on any one of the blades 16 will induce a primary current I(p) on the current sensor 47, as discussed above. This particular embodiment may be desired in that it requires minimal components and system configurations, but lacks the ability to determine a particular blade 16 that has been struck by lightning.

Referring to FIGS. 2 and 4, it should be appreciated that the signal converter sub-system 54 and processing sub-system 64 may be operably configured in relatively close proximity with the current sensor 48, or remote from the current sensor 48. The components may be configured in a single integral housing unit, or in separate connected units. Any suitable configuration of the respective components for serving the functionalities discussed herein are within the scope and spirit of the invention.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for detecting lightning strikes on a wind turbine, comprising:
    a lightning strike receptor located on a component of the wind turbine and electrically coupled to a ground conductor;
    a current sensor disposed on said ground conductor, said current sensor generating a primary current I(p) that is proportional to a lightning strike current flowing through said ground conductor upon a lighting strike on said receptor;
    a signal converter sub-system configured to generate a processing signal by stepping down said primary current I(p) to a signal current I(s) that is proportional to a magnitude of the lightning strike; and,
    a processing sub-system configured to receive and use said processing signal to determine an actual lightning strike on the wind turbine.

2. The system as in claim 1, wherein said processing sub-system is configured to indicate an actual lightning strike on the wind turbine when said processing signal exceeds a threshold value.

3. The system as in claim 2, wherein said processing sub-system is interfaced with a wind turbine controller to transmit indication of the actual lightning strike to said wind turbine controller.

4. The system as in claim 3, wherein said wind turbine controller is in communication with a remote monitoring station, wherein parameters indicative of a lightning strike on the wind turbine are conveyed to said remote monitoring station.

5. The system as in claim 2, wherein said processing sub-system further comprises a processing unit configured to further process said processing signal to define a magnitude of the lightning strike as a function of said processing signal.

6. The system as in claim 5, wherein the magnitude of the lightning strike is determined by comparison of the processing signal to a plurality of threshold values that define magnitude ranges.

7. The system as in claim 1, wherein said receptor is mounted to a blade of the wind turbine and electrically coupled to a ground conductor disposed within said blade, said current sensor configured with said blade ground conductor, wherein a lighting strike on the individual respective said blade is detected and registered by said processing sub-system.

8. A system for detecting lightning strikes on a wind turbine, comprising:
    a lightning strike receptor located on a component of the wind turbine and electrically coupled to a ground conductor;
    a current sensor disposed on said ground conductor, said current sensor generating a primary current I(p) that is proportional to a lightning strike current flowing through said ground conductor upon a lighting strike on said receptor;
    a signal converter sub-system configured convert rt said primary current I(p) into a processing signal;
    a processing sub-system configured to receive and use said processing signal to determine an actual lightning strike on the wind turbine; and
    wherein said current sensor comprises a core member with a primary winding disposed around said ground conductor, said primary current I(p) induced in said primary winding, and said signal converter sub-system comprises one or more current transformers arranged in series with said current sensor to step down said primary current I(p) to a signal current I(s).

9. The system as in claim 8, wherein signal converter sub-system further comprises a converter that converts said signal current I(s) to a signal voltage (V(s)), said signal voltage V(s) received by said comparator and compared to a threshold voltage for providing an indication of a lightning strike on the wind turbine.

10. A wind turbine, comprising:
    a plurality of turbine blades mounted to a rotor hub, each of said turbine blades comprising a root, a tip, and a pressure side and a suction side extending between said tip and said root;
    said turbine blades further comprising a plurality of lightning receptors configured along either or both of said pressure side or said suction side and electrically coupled to a blade ground conductor disposed within said blade;
    said blade ground conductors electrically coupled to a main ground conductor;
    a current sensor disposed on at least one of said main ground conductor or one of said blade ground conductors, said current sensor generating a primary current I(p) that is proportional to a lightning strike current flowing through said main or blade ground conductor upon a lighting strike on said receptor;

a signal converter sub-system configured to generate a processing signal by stepping down said primary current I(p) to a signal current I(s) that is proportional to a magnitude of the lightning strike; and, a processing sub-system configured to receive and use said processing signal to determine an actual lightning strike on the wind turbine.

11. The wind turbine as in claim 10, wherein a respective said current sensor is configured with each said blade ground conductor such that lightning strikes on individual respective blades are detected and registered by said processing sub-system.

12. The wind turbine as in claim 11, wherein a respective said current sensor is configured with each said receptor.

13. The wind turbine as in claim 10, further comprising a wind turbine controller interfaced with a remote monitoring station, said processing sub-system interfaced with said wind turbine controller, wherein an indication of an actual lightning strike on said wind turbine is transmitted to said wind turbine controller and said remote monitoring station.

14. A wind turbine, comprising:
a plurality of turbine blades mounted to a rotor hub, each of said turbine blades comprising a root, a tip, and a pressure side and a suction side extending between said tip and said root;
said turbine blades further comprising a plurality of lightning receptors configured along either or both of said pressure side or said suction side and electrically coupled to a blade ground conductor disposed within said blade;
said blade ground conductors electrically coupled to a main ground conductor;
a current sensor disposed on at least one of said main ground conductor or one of said blade ground conductors, said current sensor generating a primary current I(p) that is proportional to a lightning strike current flowing through said main or blade ground conductor upon a lighting strike on said receptor;
a signal converter sub-system configured to convert said primary current I(p) into a processing signal;
a processing sub-system configured to receive and use said processing signal to determine an actual lightning strike on the wind turbine; and
wherein said current sensor comprises a core member with a primary winding disposed around said ground conductor, said primary current I(p) induced in said primary winding, and said signal converter sub-system comprises one or more current transformers arranged in series with said current sensor to step down said primary current I(p) to a signal current I(s).

15. The wind turbine as in claim 14, wherein signal converter sub-system further comprises a converter that converts said signal current I(s) to a signal voltage V(s), said signal voltage V(s) received by said comparator and compared to a threshold voltage for providing an indication of a lightning strike on the wind turbine.

16. A method for detecting lightning strikes on a wind turbine, comprising:
detecting and measuring a parameter that is indicative of an actual lightning strike on a component of the wind turbine;
comparing the measured parameter to a threshold value, wherein the threshold value is set such that a magnitude of the measured parameter equal to or exceeding the threshold value indicates an actual lightning strike on the wind turbine; and
wherein the detected parameter is current induced in a conductor from a lightning strike on a component of the wind turbine, the method further comprising stepping down the current to a signal current and converting the signal current into a processing signal that is proportional to a magnitude of the lightning strike.

17. The method as in claim 16, further comprising setting a plurality of the threshold values to define ranges within which the processing signal falls, whereby a magnitude of the lightning strike is determined by the ranges.

18. The method as in claim 17, wherein one of the threshold values is set at a warranty limit for the component of the wind turbine blade struck by lightning.

19. The method as in claim 16, further comprising transmitting indication of an actual lightning strike to a remote monitoring station.

* * * * *